(12) United States Patent
Kobayashi

(10) Patent No.: US 6,768,258 B2
(45) Date of Patent: Jul. 27, 2004

(54) METHOD FOR MANUFACTURING ORGANIC EL DEVICE, ORGANIC EL DEVICE, AND ELECTRONIC APPARATUS

(75) Inventor: Hidekazu Kobayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 122 days.

(21) Appl. No.: 09/925,324

(22) Filed: Aug. 10, 2001

(65) Prior Publication Data

US 2002/0057052 A1 May 16, 2002

(30) Foreign Application Priority Data

Aug. 11, 2000 (JP) ........................................ 2000-244589
Aug. 10, 2001 (JP) ........................................ 2001-244852

(51) Int. Cl.$^7$ .............................. H05B 33/00; H01J 1/62
(52) U.S. Cl. ........................ 313/504; 313/510; 313/506
(58) Field of Search .............................. 345/36, 45, 76; 428/117; 313/504, 506, 510; 445/24; 257/40, 99, 103; 427/66

(56) References Cited

U.S. PATENT DOCUMENTS

| | | | |
|---|---|---|---|
| 3,330,983 A | * 7/1967 | Dickson | ...................... 313/499 |
| 6,140,764 A | * 10/2000 | Xu et al. | ...................... 313/504 |
| 6,307,324 B1 | * 10/2001 | Hirano et al. | ............ 315/169.3 |
| 6,531,815 B1 | * 3/2003 | Okuyama et al. | ........... 313/506 |
| 6,541,918 B1 | * 4/2003 | Yudasaka | .................. 315/169.3 |

\* cited by examiner

*Primary Examiner*—Vip Patel
*Assistant Examiner*—Glenn Zimmerman
(74) *Attorney, Agent, or Firm*—Oliff & Berridge, PLC

(57) ABSTRACT

The present invention provides a method for manufacturing an organic EL device, a simple method for connecting a cathode and a cathode terminal. First, anodes are formed on a substrate, and a cathode terminal is simultaneously formed. Next, a hole injection layer and a light-emitting layer are formed over the entire surface of the substrate by spin coating. Subsequently, at a position corresponding to the cathode terminal, a liquid containing powdered silver and a solvent is dripped from a container of a dispenser. As this solvent, a solvent that dissolves the hole injection layer and the light-emitting layer is used. Accordingly, a through-hole is provided at the position corresponding to the cathode terminal, and this throughhole is filled with silver. Next, a cathode layer is formed so as to cover the position at which the throughhole is provided.

12 Claims, 4 Drawing Sheets

METHOD FOR MANUFACTURING ORGANIC EL DEVICE, ORGANIC EL DEVICE, AND ELECTRONIC APPARATUS

BACKGROUND OF THE INVENTION

1. Field of the Invention

The present invention relates to methods for manufacturing organic EL (electroluminescence) devices. The organic EL devices can be used, for example, as a display of a television as well as a computer, and also as a light source such as a backlight of a liquid crystal display.

2. Description of Related Art

Recently, there has been an increasing trend toward portability of information terminals, along with the development of power saving displays, which becomes necessary to achieve portability. In particular, attention has be given to organic EL displays that are light-emitting devices having a structure in which an organic light-emitting layer is provided between an anode and a cathode.

In a small-capacity display device or a monochrome organic EL device used as a backlight, for example, after an anode layer is formed on a substrate, a light-emitting layer (and a hole injection layer and/or a hole transport layer provided when necessary) is formed by a spin coating method in many cases. In addition, a cathode layer is formed on the light-emitting layer, for example, by a vacuum deposition method.

The organic EL device described above generally includes an organic EL panel and a driving circuit which are separately formed, along with an anode terminal as well as a cathode terminal that are provided for the organic EL panel. By connecting these terminals to front ends of wires extending from the driving circuit, a voltage is applied between the anode and the cathode.

Conventionally, the formation of the cathode terminal has been performed by the following methods. The first method is a method that a part of each cathode layer uses as a cathode terminal. In other words, front ends of wires extending from a driving circuit are brought into direct contact with the cathode layer and then fixed. In a second method a cathode terminal is formed of a conductive paste on the cathode layer. In a third method a cathode terminal is formed on a substrate at the same time that anode is formed. In this case, after the step described above, a light-emitting layer is formed over the entire surface of a substrate, and the light-emitting layer is partly removed so that the cathode terminal is exposed. A cathode layer is then formed so as to cover the cathode terminal. However, the above methods have the problems described below.

In the first method, since the cathode layer of the organic EL device is formed of an unstable material in many cases, there is a risk that the cathode terminal may be oxidized. In the second method, there is a risk that the cathode may corrode due to a solvent of the conductive paste. In the third method, the step of partly removing the light-emitting layer so as to expose the terminal for the cathode is complicated, and in addition, there is a risk that superior electric connection to the cathode layer may not be obtained at the side surface of the light-emitting layer or the like which is formed by the partial removal thereof.

SUMMARY OF THE INVENTION

The present invention provides a method for manufacturing an organic EL device in which at least a first electrode layer, a light-emitting layer, and a second electrode layer are sequentially formed on a substrate. The method for manufacturing the organic EL device can include a step of forming the first electrode layer, a first terminal connected to the first electrode layer, and a second terminal to be connected to the second electrode layer on the substrate, a step of forming the light-emitting layer so as to cover at least the first electrode layer and the second terminal, a step of providing a conductive material penetrating the light-ermtting layer so as to be electrically connected to the secnd terminal, and a step of forming the second eelectrode layer so as to be electrically connected to the conductive material.

The present invention also provides a method for manufacturing an organic EL device in which at least a first electrode layer, a light-emitting layer, and a second electrode layer are sequentially formed on a substrate. The method for manufacturing the organic EL device described above can include a step of forming the first electrode layer, a first terminal for the first electrode layer, and a second terminal for the second electrode layer on the substrate, a step of forming the light-emitting layer so as to cover at least the first electrode layer and the second terminal, a step of supplying a liquid containing a solvent that dissolves the light-emitting layer and a conductive material to a position on the light-emitting layer corresponding to the second terminal so as to form a throughhole which extends to the second terminal, in the light-emitting layer using the solventr so-that the liquid remains in the throughhole, a step of removing the solvent remaining in the throughhole so as to fill the throughhole with the conductive material, and a step of forming the second electrode layer so as to be electrically connected to the conductive material and so as to cover a position at which the throughhole is provided.

The present invention also provides a method for manufacturing an organic EL device in which at least a first electrode layer, a light-emitting layer, and a second electrode layer are sequentially formed on a substrate. The method for manufacturing the organic EL device described above can include a step of forming the first electrode layer, a first terminal for the first electrode layer, and a second terminal for the second electrode layer on the substrate, a step of forming the light-emitting layer so as to cover at least the first electrode layer and the second terminal, a step of supplying a liquid containing a volatile solvent that dissolves the light-emitting layer and a conductive material to a position on the light-emitting layer corresponding to the second terminal so as to form a throughhole, which extends to the second terminal, in the light-emitting layer using the volatile solvent, and removing the volatile solvent so as to fill the throughhole with the conductive material, and a step of forming the second electrode layer at a position at which the throughhole is provided so as to be electrically connected to the conductive material.

The present invention provides an organic EL device including at least a first electrode layer, a light-emitting layer, and a second electrode layer provided in that order on a substrate. In the organic EL device, a first terminal connected to the first electrode layer and a second terminal for the second electrode layer are formed on the same surface as that on which the first electrode layer is provided, and the second terminal and the second electrode layer are in electrical contact with each other through a conductive material penetrating the layer rovided therebetween.

The present invention provides an electronic apparatus including an organic EL device. The organic EL device comprises at least a first electrode layer, a light-emitting layer, and a second electrode layer in that order on a substrate, wherein a first terminal connected to the first electrode layer and a second terminal for the second electrode layer are formed on the same surface of the substrate as that on which the first electrode layer is provided, and the second terminal and the second electde layer are in electrical contact with each other through a conductive material penetrating the layer provided therebetween.

BRIEF DESCRIPTION OF THE DRAWINGS

The invention will be described with reference to the accompanying drawings, in which like elements are referred to with like numbers, and in which:

FIG. 2(a) and (b) illustrate the organic EL device (organic EL panel) manufactured in an embodiment of the present invention, in which FIG. 2(a) is a plan view showing the device in the state shown in FIG. 1(a)

DETAILED DESCRIPTION OF PREFERRED EMBODIMENTS

Figure 1A:
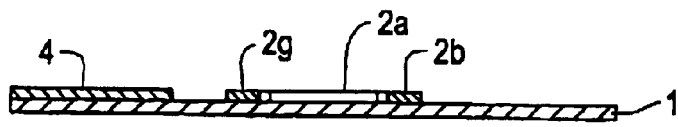
FIG. 1(a)–(f) show manufacturing steps that illustrate a method for manufacturing an organic EL device according to an embodiment of the present invention.

The present invention was made in consideration of the problems of the conventional techniques described above, and an object of the present invention is to provide a method for manufacturing an organic EL device including forming at least a first electrode layer, a light-emitting layer, and a second electrode layer on a substrate, wherein the connection between the second electrode and aterminal for this electrode reliably lasts for a long period of time, and in addition frming this terminal and forming the connection described above can easily be performed (1) In a first method for manufacturing an organic EL device according to an embodiment of the present invention, at least a first electrode layer, a light-emitting layer, and a second electrode layer are sequentially formed on a substrate. The method for manufacturing the organic EL device includes forming the first electrode layer, a first terminal connected to the first electrode layer, and a second terminal to be connected to the second electrode later on the substrate, forming the light-emitting layer so as to cover at least the first electrode layer so as the second terminal, poviding a conductive material penetrating the light-emitting layer so as to be electrically connected to the second terminal, and forming the second electrode layer so as to be electrically connected to the conductive material.

In a second method for manufacturing an organic EL device according to an embodiment of the present invention, at least a first electrode layer, a light-emitting layer, and a second electrode layer are sequentially formed on a substrate. The method for manufacturing the organic EL device including forming the first electrode layer, a first terminal for the first electrode layer, and a second terminal for the second electrode layer on the substrate, forming the light-emitting layer so as to cover at least the first electrode and the second terminal, supplying a liquid containing a solvent that dissolves the light-emitting layer and a conductive material to a position on the light-emitting layer corresponding to the second terminal so as to form a throughhole, which extends to the second terminal, in the light-emitting layer using the solvent and so that the liquid remains in the throughhole, removing the solvent remaining in the throughhole so as to fill the throughhole with the conductive material, and forming the second electrode layer so as to be electrically connected to the conductive material and so as to cover a position at which the throughhole is provided In a third method for manufacturing an organic EL device according to an embodiment of the prnt invention, at least a first electrode layer, a light-emitting layer, and a second electrode layer are sequentially formed on a substrate. The method for manufacturing the organic EL device described above including forming the first electrode layer, a first terminal for the first electrode layer, and second terminal for the second electrode layer on the substrate, forming the light-emitting lyer so as to cover at least the first electrode layer and the second terminal supplying a lquid containing a volatile solvent that dissolves the light-emitting layer and a conductive material to a position on the light-emitting layer corresponding to the second terminal so as to form a throughhole, which extends to the second terminal, in the light-emitting layer using the volatile solvent, and removing the volatile solvent so as to fill the throughhole with the conductive material, and forming the second electrode layer at a position at which the throughhole is provided so as to be electrically connected to the conductive material.

In the second and third methods described above, used as the liquid described above may be a liquid which contains a powder composed of a conductive material, such as silver, copper, chromium, nickel, aluminum, iron, gold, platinum, or carbon, dispersed in a solvent, such as toluene, xylene, or chloroform. A liquid containing a polymer having conductivity dissolved in the solvent may also be used. In addition, the liquid may contain a binder.

In the second and third methods described above, the step of supplying the liquid may be performed by a liquid discharging method using a dispenser, an inkjet method, or a printing method. However, the step is preferably performed by a liquid discharging method using a dispenser, because accuracy of positioning the liquid which is supplied is not so much required, and a conductive material must reliably exist in the throughhole described above so that the second terminal and the second electrode are electrically connected with each other through this conductive material. Accordingly, it is preferable that an inexpensive method using a dispenser be used rather than an inkjet method which has a high positioning accuracy but is expensive.

A fourth method can include the second method described above, wherein a hole injection layer may be further formed on the first electrode layer, and the solvent may be a solvent that dissolves the hole injection layer.

A fifth method can include the third method described above, wherein a hole injection layer may be further formed on the first electrode layer, and the volatile solvent may be a solvent that dissolves the hole injection layer.

An organic EL device according to an embodiment of the present invention can include at least a first electrode layer, a light-emitting layer, and a second electrode layer provided in that order on a substrate, and a first terminal connected to the first electrode layer and a second terminal for the second electrode layer, which are formed on the same surface of the substrate as that on which the first electrode layer is provided, wherein the second terminal and the second electrode layer are in electrical contact with each other through a conductive material penetrating the layer provided therebetween.

An electronic apparatus according to an embodiment of the present invention can be provided with an organic EL device including at least a first electrode layer, a light-emitting layer, and a second electrode layer provided in that order on a substrate. The organic EL device further comprises a first terminal connected to the first electrode layer and a second terminal for the second electrode layer, which are formed on the same surface of the substrate as that on which the first electrode layer is provided, wherein the second terminal and the second electrode layer are in electrical contact with each other through a conductive material penetrating the layer provided therebetween.

Hereinafter, embodiments of the present invention will be described with reference to the drawings. It is to be understood the present invention is not limited to the embodiments described below.

Figure 1B:
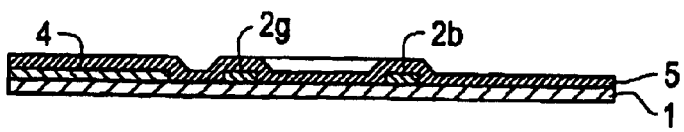
Figure 1C:
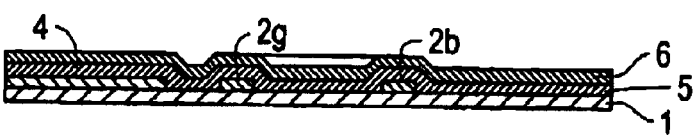
Figure 1D:
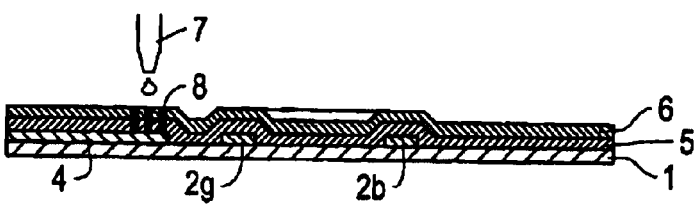
Figure 1E:
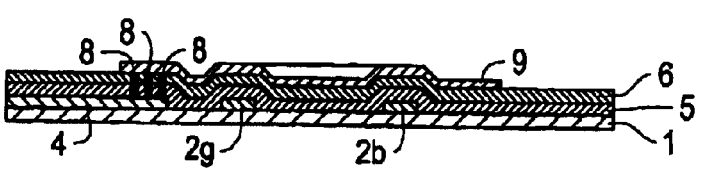
Figure 1F:
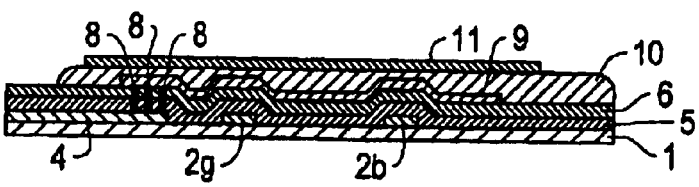
Figure 2A:
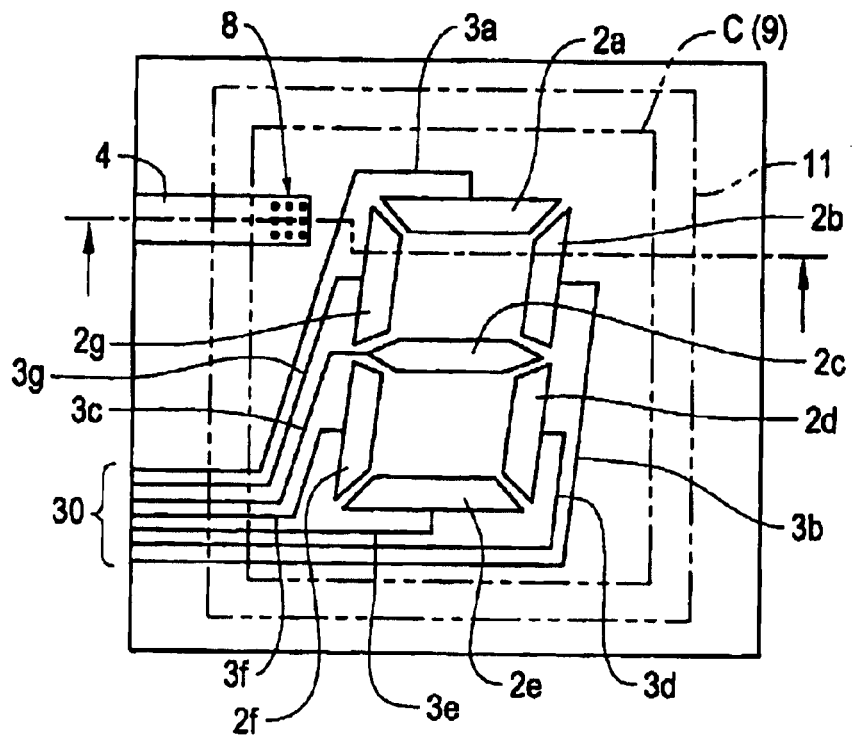
Figure 2B:
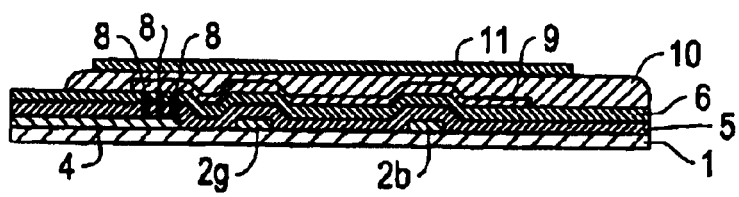
FIG. 2(b) is a cross-sectional view of this organic EL device.

FIG. 1 shows manufacturing steps that illustrate a method for manufacturing an organic EL device according to an embodiment of the present invention. FIGS. 2(a) and (b) illustrate the organic EL device (organic EL panel) manufactured in this embodiment, in which FIG. 2(a) is a plan view showing the device in the state shown in FIG. 1(a) excluding an area indicated by the character B. FIG. 1(a) is a view corresponding to a cross-sectional view taken along the line A—A in FIG. 2(a). FIG. 2(b) is a cross-sectional view of this organic EL panel.

The organic EL panel according to this embodiment can include seven segments, which is a light-emitting portion composed of organic EL elements, for constituting digital numerals. This organic EL panel is a display device for displaying a digital numeral or the like by emitting light from some of the segments as necessary. The organic EL panel described above can be formed as described below.

First, an ITO ($In_2O_3$—$SnO_2$) thin-film with 150 nm thickness can be formed by a sputtering method on a transparent glass substrate 1, and using photolithography and etching method transparent anodes (first electrode layers) 2a to 2g corresponding to the seven segments described above, wires 3a to 3g for the individual anodes 2a to 2g, and a terminal (second terminal) 4 for the cathode on the surface of the substrate are formed. FIG. 1(a) shows the state described above. As the substrate, in addition to the glass substrate, a plastic film may also be used.

As shown in FIG. 2(a), the terminal 4 for the cathode can be formed at one position at the periphery of the substrate surface being in a strip shape having a predeterminedwdth. One end of each of the wires 3a to 3g is connected to each of the anodes 2a to 2g, and the other ends of the wires 3a to 3g are collectively disposed in parallel with each other, at regular intervals, at positions alongside of the cathode terminal 4 at the periphery of the substrate. A part of each of the wires 3a to 3g located at the periphery of the substrate (the other ends) is used as a terminal for each of the anodes 2a to 2g. In FIG. 2(a), the terminals (first terminals) for the anodes 2a to 2g are collectively indicated by reference numeral 30. In addition, in FIG. 1 and FIG. 2(b), the wires 3a to 3g are omitted. After these anodes are formed, a UV ozone treatment or an $O_2$ plasma treatment may be performed.

Next, over the entire surface of the glass substrate 1, "Baytron" (registered trademark) manufactured by Bayer AG can be applied by a spin coating method, whereby a hole injection layer with 50 nm thickness is forrmed. Accordingly, the anodes 2a to 2g, the wires 3ato 3g, the terminals (anode terminals) 30 for the anodes, and the terminal (cathode terminal) 4 for the cathode are all covered by the hole injection layer 5. FIG. 1(b) shows the state described above. As the hole injection layer, a polyaniline derivative, a polythiophene derivative, or a phenylamine derivative may also be used. In addition, as a film-forming method, in addition to a spin coating method, a deposition method, or a roll coating method may also be used.

Next, a toluene solution containing poly(dioctyl fluorene) at a concentration of 1.5 wt % is applied over the entire surface of the hole injection layer 5 by a spin coating method and is then dried, thereby forming a light-emitting layer 6 having a thickness of 70 nm. FIG. 1(c) shows the state described above. As the light-emitting material, a material such as a polyparaphenylene vinylene derivative or Alq3, which is commonly used for organic EL, is used. In addition, LiF, for example, may form an electron injection layer or a hole block layer.

Next, liquid of "Dotite" (registered trademark) manufactured by Fujikura Kasei Co., Ltd., which is a silver paste (a conductive paste containing powdered silver), and toluene mixed in a volume ratio of 1 to 1, is contained in a container 7 of a dispenser having a circular liquid discharge opening with 0.5 mm diameter. The container 7 of this dispenser is disposed so that the position of the liquid discharge opening is located at a distance of 0.5 mm from the upper surface of the light-emitting layer and at a position corresponding to one of the nine positions in the substrate surface shown by the character B in FIG. 2(a) (a position corresponding to the cathode terminal 4 covered by a light-emitting layer 6 in the substrate surface).

In the state described above, pressurized air can be fed into the container 7 from pressurized air tubing (pressure supply means), so that 500 picoliter of the liquid was discharged at a discharge pressure of 0.1 MPa. In addition, this discharge can be repeatedly performed by moving the container 7 to the other positions at which the liquid is to be discharged. In the step described above, since the light-emitting layer 6 and the hole injection layer 5 are dissolved in the toluene which is a solvent of the liquid, the liquid is discharged from the container 7 forming throughholes extending from the light-emitting layer 6 to the cathode terminal 4 via the hole injection layer 5 and simultaneously enters the throughholes. When the liquid in the throughholes is dried, these throughholes are filled with silver (conductive material) 8. This drying step is performed by heating or by holding the laminate thus formed at room temperature for a predetermined time. FIG. 1(d) shows the state described above. In this embodiment, a silver paste was used, however, it is to be understood a material that can impart the conductivity may be used. For example, powdered copper, powdered chromium, powdered nickel, powred aluminum, powdered iron, powdered gold, powdered platinum, or carbon, which is dispersed in a solvent having compatibility with the light-emitting layer, may be used. Alternatively, a solution containing a polymer having conductivity may also be used. In addition, a binder may be contained.

Next, a calcium thin-film with 10 nm thickness and an aluminum thin-film with 400 nm thickness were sequentially formed by a vacuum deposition method on the light-emitting layer 6 within the area (an area including the throughholes filled by silver) indicated by the two-dot chain line C shown in FIG. 2(a). Accordingly, the cathode (second cathode) 9 having a two-layered structure composed of calcium and aluminum is formed, and by the silver 8 penetrating the light-emitting layer 6 and the hole injection layer 5, the cathode terminal 4 and the cathode 9 are electrically connected with each other. FIG. 1(e) shows this state. As the cathode, an optimum material may be selected in accordance with a light-emitting layer and an electron injection layer, which are to be used, for example, or may be selected from the group including Ca, Li, Mg, and the alloy thereof. In addition, a film formed of a relatively stable metal, such as Al, Ag, or Au, may be used on the cathode. As the method for forming the film, in addition to a deposition method (a heat deposition method, an EB deposition method), a sputtering method may also be used.

Next, the upper surface and side surfaces of the cathode 9 are sealed. In this embodiment, a sealing material 10 composed of an epoxy resin is provided so as to cover the entire upper surface and all side surfaces of the cathode 9, and a glass plate 11 for sealing is provided thereon. That is, in the state shown in FIG. 1(e), after the epoxy resin forming the sealing material 10 is applied, the glass plate 11 is placed thereon, and the epoxy resin is then cured, whereby the glass plate 11 is fixed on the sealing material 10. FIG. 1(f) shows this state. In addition, as the sealing method, sealing may be performed using a metal or a glass. In both sealing methods, as necessary, a desiccant or a deoxidizer may be enclosed in the sealed area. In addition, there is a method for forming a thin-film having superior gas barrier properties, such as aluminum nitride, silicon nitride, or silicon oxide, by deposition or sputtering. When wires extending from a driving circuit are connected between the anode terminals 30 of the organic EL panel (organic EL device) thus formed and the cathode 4, and a voltage is applied between the cathode 9 and all of the anodes 2a to 2g, the seven segments forming digital numerals stably emit light, whereby numeral "8" is displayed.

In addition, according to this method, it is confirmed that the connection between the cathode terminal 4 and the cathode 9 can reliably last for a long period of time. In addition, according to this method, the step of forming the cathode terminal is equivalent to that of the third conventional method, however, since it is not necessary to remove, for example, a part of the light-emitting layer as described in the third method, the step of connecting the cathode terminal to the cathode is more easily performed.

In the embodiment described above, the step of positioning the liquid is performed by a liquid discharging method using a dispenser, however, an ink-jet method or a screen printing method may also be used.

In the method for discharging a liquid by using a dispenser, since the step of positioning the liquid can be performed more easily at a lower cost compared to the other methods, it is preferable that the method for discharging a liquid using a dispenser be used.

In the case in which the liquid is positioned by an ink-jet method, it is preferable that the viscosity of the liquid be lower than that in the case of using a dispenser. In the case in which the silver paste is used, for example, the silver paste diluted by 10 times its volume by a solvent, such as xylene, is discharged.

In the case in which the liquid is positioned by a screen printing method, the viscosity of the liquid may be higher than that used in the case of using a dispenser, and for example, the silver paste described above may be used as it is. In this case, when a solvent contained in the silver paste is penetrated into the light-emitting layer 6 and the hole injection layer 5 by a pressure applied while the printing is performed, the throughholes may also be formed.

In addition, in the embodiments described above, since the transparent glass substrate 1 is used as a substrate, the transparent anodes 2a to 2g are provided at the substrate side, and the cathode 9 is opaque, the light generated in the light-emitting layer 6 is reflected on the cathode 9 and is emitted to the glass substrate 1 side; however, by forming an opaque electrode (the first electrode) at the substrate side and a transparent second electrode, the light generated in the light-emitting layer may be emitted to the side opposite to the substrate. As the material for the cathode, ITO, or a metal material formed into a thin-film having transparency, such as gold, silver, copper, or a metal having a low work function, such as calcium, magnesium, cesium, strontium, or rubidium, may be used. In addition, a thin-film alloy compose of magnesium and silver or of aluminum and lithium may also be used.

In addition, in the embodiments described above, the electrode (first electrode) at the substrate side is used as the anode, and the electrode (second electrode) at the side opposite to the substrate is used as the cathode; however, the first electrode may be used as the cathode, and the second electrode may be used as the anode.

Furthermore, the organic EL device of the present invention may be applied to various electronic apparatuses, such as a mobile personal computer, a mobile phone, or a digital still camera.

Figure 3:
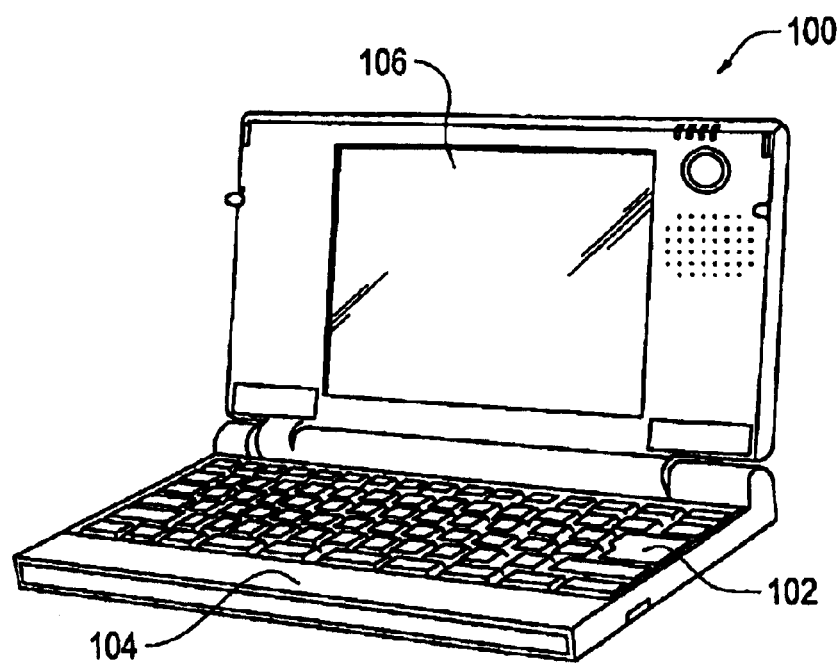
FIG. 3 is a perspective view showing the structure of a personal computer as an example of an electronic apparatus to which an organic EL device of the present invention is applied.

FIG. 3 is a perspective view showing the structure of a mobile personal computer. In FIG. 3, a personal computer 100 has a structure composed of a main body 104 provided with a keyboard 102 and a display unit 106 formed of the organic EL device of the present invention.

Figure 4:
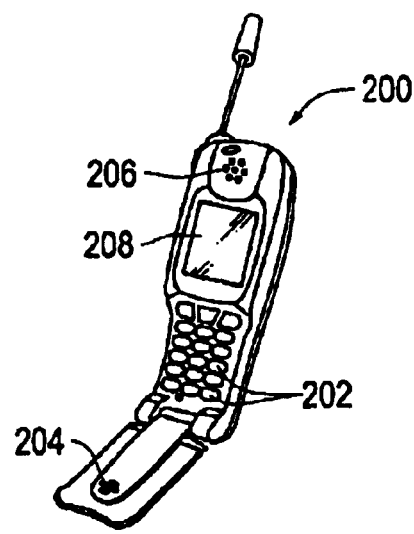
FIG. 4 is a perspective view showing the structure of a mobile phone as an example of an electronic apparatus to which an organic EL device of the present invention is applied.

FIG. 4 is a perspective view of a mobile phone. In FIG. 4, a mobile phone 200 comprises, in addition to a plurality of operation buttons 202, an ear piece 206, a mouthpice 204, and a display panel 208 formed of the organic EL device of the present invention.

Figure 5:
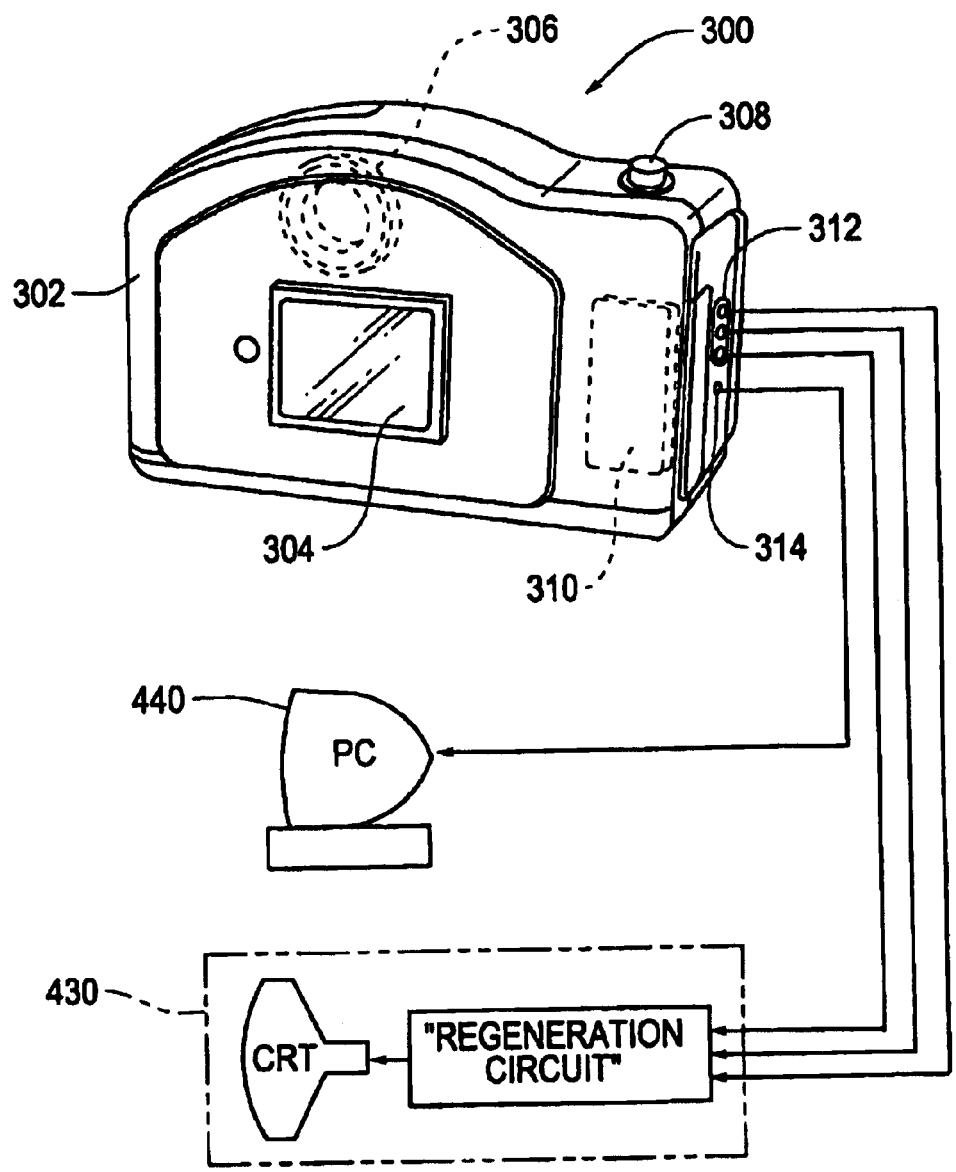
FIG. 5 is a perspective view showing the structure of a digital still camera as an example of an electronic apparatus to which an organic EL device of the present invention is applied.

FIG. 5 is a perspective view showing the structure of a digital still camera 300. In the figure, the connection with external apparatuses is also briefly shown. Compared to a typical camera which exposes a film to an optical image of an object, a digital camera 300 produces image signals by performing photoelectric conversion of an optical image of an object using an imaging element such as a CCD (Charged Coupled Device).

A display panel 304 composed of the organic EL device of the present invention is provided on the back surface of a case 302 of the digital still camera 300, and the structure is formed so as to perform display in accordance with image signals provided from the CCD. Accordingly, the display panel 304 serves as a viewfinder for displaying the object. In addition, a light-receiving unit 306 containing an optical lens and the CCD, for example, is provided on an observing side (the back surface side in the figure) 302.

When a picture taker views an object image displayed on the display panel 304 and then presses a button 308, an image signal of the CCD at that time is transferred to and stored in a memory of a circuit substrate 310. In addition, in this digital still camera 300, a video signal output terminal 312 and an input/output terminal 314 for data communication are provided on the side surface of the case 302.

In addition, as shown in the figure, a television monitor 430 and a personal computer 440 are connected, as required, to the video signal output terminal 312 and the input/output terminal 314 for data communication, respectively. Furthermore, the structure is formed so that the image signal stored in the memory of the circuit substrate 310 is output on the television monitor 430 or to the personal computer 440 by a predetermined operation.

As an electronic apparatus to which the organic EL device of the present invention can be applied as a display unit, for example, in addition to the personal computer in FIG. 3, the mobile phone in FIG. 4, and the digital still camera in FIG. 5, there may be a television, a viewfinder type or a direct viewing video tape recorder, a car navigation apparatus, a pager, an electronic notebook, an electronic calculator, a word processor, a workstation, a television phone, a point of sale (POS) terminal and an apparatus provided with a touch panel.

As has thus been described, according to the method of the present invention, in the method for manufacturing an organic EL device in which at least a first electrode layer, a light-emitting layer, and a second electrode layer are sequentially formed on a substrate, connection between a second electrode and a terminal therefor can reliably last for a long period of time, and in addition, a method for easily performing this terminalforming step and the step of forming the connection above is provided.

What is claimed is:

1. An organic EL device, comprising:

at least a first electrode layer, a light-emitting layer, and a second electrode layer formed, in that order, above a substrate; and a first terminal that is connected to the first electrode layer and a second terminal connected to the second electrode layer, which are formed above a same surface of the substrate as that above which the first electrode layer is formed;

wherein the second terminal and the second electrode layer at least partially face each other via a through hole and are electrically connected to each other by a conductive material in the through hole which penetrates at least one intervening layer between the second terminal and the second electrode layer;

wherein the intervening layer is the light-emitting layer.

2. An electronic apparatus, comprising an organic EL device, the organic EL device further comprising:

at least a first electrode layer, a light-emitting layer, and a second electrode layer formned, in that order, above a substrate;

a first terminal connected to the first electrode layer and a second terminal connected to the second electrode layer, which are formed above a same surface of the substrate as that above which the first electrode layer is formed;

wherein the second terminal and the second electrode layer at least partially face each other via a through hole and are electrically connected to each other by a conductive material in the through hole which penetrates at least one intervening layer between the second terminal and the second electrode layer;

wherein the intervening layer is the light-emitting laeer.

3. An organic EL device, comprising:

a first electrode formed on or over one surface of a substrate and connected to a first terminal;

a second electrode formed over the first electrode;

a light-emitting layer formed between the first and the second electrode, in which a through hole is formed;

a second terminal formed on or over the same surface of the substrate as the first electrode, at least a part of which faces the second electrode via the through hole; and a conductive material filled in the through hole and electrically connecting the second electrode and the second terminal.

4. The organic EL device according to claim 3, the second electrode being formed on the conductive material and in contact thereto.

5. The organic EL device according to claim 4, the second electrode having a plurality of layers, the bottom layer of which is in contact with the conductive material.

6. The organic EL device according to claim 5, the plurality of layers include a calcium layer and aluminum layer, and the calcium layer is in contact with the conductive material.

7. The organic EL device according to claim 3, the conductive material including a material selected from a group consisting of silver, copper, chromium, nickel, aluminum, iron, gold, platinum, carbon and a polymer with conductivity.

8. The organic EL device according to claim 3, the second electrode having the property of transparency.

9. The organic EL device according to claim 8, the conductive material including a material selected from a group consisting of an ITO, gold, silver, copper, calcium, magnesium, cesium, strontium and rubidium, and alloys composed of magnesium and silver and of aluminum and lithium.

10. The organic EL device according to claim 9, the first electrode having no transparency.

11. The organic EL device according to claim 3, a binder being provided in the through hole along with the conductive material.

12. The organic EL device according to claim 3, further comprising a hole injection layer between the first and the second electrodes, the through hole being provided in the hole injection layer.

* * * * *